(12) United States Patent
Kobayashi (10) Patent No.: US 12,106,990 B2
(45) Date of Patent: Oct. 1, 2024

(54) GRIPPER DEVICE, CONVEYANCE VEHICLE, AND CONVEYANCE METHOD

(71) Applicant: MURATA MACHINERY, LTD., Kyoto (JP)

(72) Inventor: Makoto Kobayashi, Inuyama (JP)

(73) Assignee: MURATA MACHINERY, LTD., Kyoto (JP)

(*) Notice: Subject to any disclaimer, the term of this patent is extended or adjusted under 35 U.S.C. 154(b) by 122 days.

(21) Appl. No.: 17/910,381

(22) PCT Filed: Jan. 27, 2021

(86) PCT No.: PCT/JP2021/002789
§ 371 (c)(1),
(2) Date: Sep. 9, 2022

(87) PCT Pub. No.: WO2021/181924
PCT Pub. Date: Sep. 16, 2021

(65) Prior Publication Data
US 2023/0140218 A1    May 4, 2023

(30) Foreign Application Priority Data
Mar. 13, 2020    (JP) ................. 2020-044634

(51) Int. Cl.
   *H01L 21/677*     (2006.01)
   *B66C 1/28*     (2006.01)
   *B66C 19/00*     (2006.01)

(52) U.S. Cl.
   CPC ........ *H01L 21/67706* (2013.01); *B66C 1/28* (2013.01); *B66C 19/00* (2013.01); *H01L 21/6773* (2013.01); *H01L 21/67733* (2013.01)

(58) Field of Classification Search
CPC ......... H01L 21/6773; H01L 21/67733; H01L 21/67379; H01L 21/68707; H01L 21/687;
(Continued)

(56) References Cited

U.S. PATENT DOCUMENTS

2006/0013674 A1*   1/2006   Elliott ............... H01L 21/67775
                                                                    414/940
2008/0011742 A1*   1/2008   Bellehumeur .......... B66C 1/663
                                                                    220/1.5

(Continued)

FOREIGN PATENT DOCUMENTS

JP     2000-072378 A    3/2000
JP     2016-163001 A    9/2016

*Primary Examiner* — Glenn F Myers
(74) *Attorney, Agent, or Firm* — Keating & Bennett, LLP (57) ABSTRACT

A gripper device includes: a holding portion that is attached to an elevating section capable of lifting and lowering above a transfer section to hold an article, a first positioning section that is attached to the elevating section and that positions the holding portion in a horizontal direction with respect to the article by contacting the article at two first contact positions in an upper portion of the article, and a second positioning section that is attached to the elevating section and that positions the holding portion in a height direction with respect to the article by contacting the article at three second contact positions that are not located on a straight line in the upper portion of the article.

7 Claims, 11 Drawing Sheets

(58) Field of Classification Search
CPC ......... H01L 21/67373; H01L 21/67736; H01L 21/67706; B61B 3/02; B66C 21/00; B66C 1/28; B66C 1/101; B66C 19/00; B65G 2811/09; B65G 2201/0297; B25J 15/009; B25J 15/0253

See application file for complete search history.

(56) References Cited

U.S. PATENT DOCUMENTS

| | | | | |
|---|---|---|---|---|
| 2010/0117391 | A1* | 5/2010 | Murata | ............... H01L 21/6773 294/86.4 |
| 2011/0024377 | A1* | 2/2011 | Yamamoto | ........ H01L 21/67733 212/71 |
| 2017/0323817 | A1* | 11/2017 | Kobayashi | ........ H01L 21/67712 |

* cited by examiner

GRIPPER DEVICE, CONVEYANCE VEHICLE, AND CONVEYANCE METHOD

BACKGROUND OF THE INVENTION

1. Field of the Invention

The present disclosure relates to a gripper device that holds an article, a conveyance vehicle including the gripper device, and a conveyance method for holding to carry the article.

2. Description of the Related Art

A gripper device supporting storage containers is known, as described in Japanese Unexamined Patent Publication No. 2016-163001. This gripper device includes a center cone protruding downward at approximately a center of an elevating platform and a pair of finger sections that support storage containers from below. When the gripper device is lowered from above the storage container, the pair of finger sections are guided into a flange section of the storage container and the center cone is inserted into an insertion hole of the flange section. As a result, the gripper device is positioned with respect to the storage container.

SUMMARY OF THE INVENTION

In the conventional gripper device described above, only one center cone is used for positioning, which may result in insufficient positioning in a height direction. If positioning is performed by a center cone having a hemispherical outer surface, there is a risk of residual misalignment in a rotational direction around the center cone.

Preferred embodiments of the present disclosure provide gripper devices, conveyance vehicles, and conveyance methods capable of providing accurate positioning in a horizontal direction and a height direction for an article.

One aspect of a preferred embodiment of the present disclosure is a gripper device that holds an article placed on a transfer section, the gripper device including a holding portion that is attached to an elevating section capable of lifting and lowering above the transfer section to hold the article, a first positioning section that is attached to the elevating section to position the holding portion in a horizontal direction with respect to the article by contacting the article at two first contact positions in an upper portion of the article, and a second positioning section that is attached to the elevating section to position the holding portion in a height direction with respect to the article by contacting the article at three second contact positions that are not located on a straight line in the upper portion of the article.

According to this gripper device, the first positioning section contacts the article at the two first contact positions in the upper portion of the article. Contact of the first positioning section provides positioning of the holding portion in the horizontal direction with respect to the article. The second positioning section contacts the article at the three second contact positions in the upper portion of the article. Since these three second contact positions are not located on the straight line, the contact of the second positioning section provides positioning of the holding portion in the height direction with respect to the article. Thus, the two contact positions in the horizontal direction and the three contact positions in the height direction are used to allow accurate positioning of the article in the horizontal direction and the vertical direction.

The first positioning section may contact the article at only the two first contact positions. When the first positioning section contacts the article at the three or more first contact positions, the position of the holding portion in the horizontal direction is not likely to be uniquely determined between two of the three positions and the other one thereof, resulting in inconsistencies. In other words, competition may occur among the three or more first contact positions. When locations of the first contact positions are limited to only two locations, such inconsistencies, that is, the competition, can be prevented.

A position detected portion provided on a top surface of the article includes an opening opened upward and includes two guide holes of a tapered shape each having an inner diameter that decreases as a height of the tapered guide hole to the opening decreases, positions at which the two guide holes are respectively located are the two first contact positions and the two second contact positions, and the first positioning sections may include two convex members that are capable of entering the respective two guide holes. In this case, the two first contact positions and the two second contact positions are made common, which makes it possible to reduce positioning sections in the number.

The second positioning section may include at least one pressing portion including a horizontal surface portion that contacts the position detected portion provided on the top surface of the article at at least one of the second contact positions. According to the pressing portion including a horizontal surface portion, positioning in the height direction can be performed accurately and easily.

There may be provided the four second contact positions at respective four locations. In this case, positioning can be performed more accurately in the height direction.

As another aspect of a preferred embodiment of the present disclosure, there may be provided a conveyance vehicle that includes either of the above-described gripper devices and travels along a track provided on a ceiling. According to this conveyance vehicle, the holding portion holds the article in a state of being accurately positioned with respect to the article. Thus, the carrying state of the article becomes stable, which makes it possible to carry the article at a high speed.

Another aspect of a preferred embodiment of the present disclosure is a conveyance method for holding to carry an article placed on a transfer section by a gripper device, in which the gripper device includes a holding portion that is attached to an elevating section capable of lifting and lowering above the transfer section to hold the article, a first positioning section to perform positioning in a horizontal direction with respect to the article, and a second positioning section to perform positioning in a height direction with respect to the article, the method including a lowering step of lowering the elevating section, a first positioning step of positioning the holding portion in the horizontal direction with respect to the article by bringing the first positioning section into contact with the article at two first contact positions in an upper portion of the article, the first positioning step being performed after the lowering step, a second positioning step of positioning the holding portion in the height direction with respect to the article by bringing the second positioning sections into contact with the article at three second contact positions that are not located on a straight line in the upper portion of the article, the second positioning step being performed after the lowering step and a holding step of holding the article by the holding portion, the holding step being performed after the first positioning step and the second positioning step.

According to this conveyance method, the same actions and effects as described above are achieved. In other words, the two contact positions are used in the horizontal direction and the three contact positions are used in the height direction to allow accurate positioning of the article in the horizontal direction and the height direction.

According to preferred embodiments of the present disclosure, positioning in the horizontal direction and the height direction to an article can be accurately performed.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
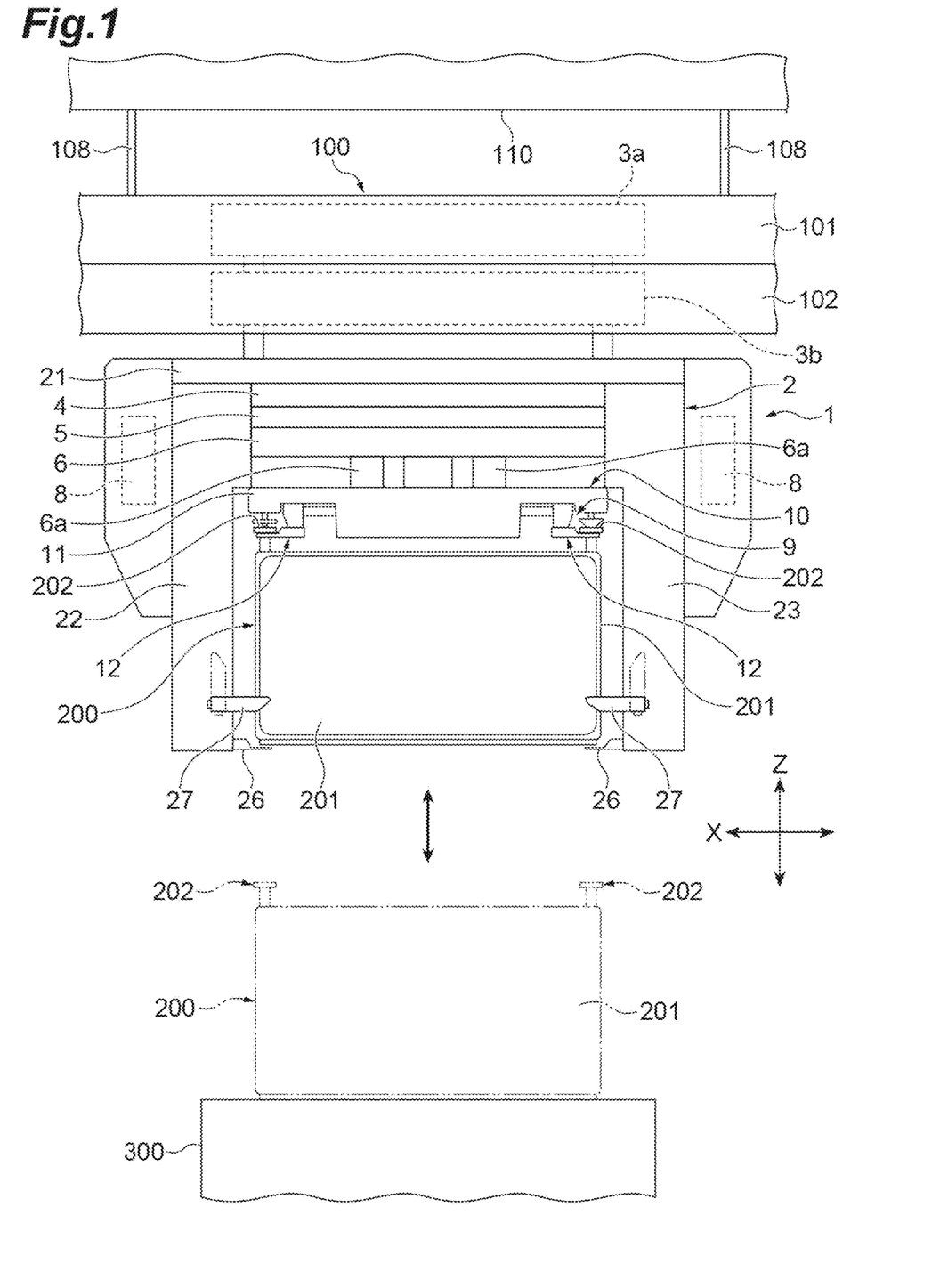
FIG. 1 is a schematic diagram illustrating a conveyance vehicle including a gripper device according to a preferred embodiment of the present disclosure.

As illustrated in FIG. 1, an overhead conveyance vehicle (conveyance vehicle) 1 according to a preferred embodiment travels along a track 100 laid on a ceiling 110 of a clean room where semiconductor devices are manufactured. The overhead conveyance vehicle 1 of the present preferred embodiment carries front opening unified pod (FOUP) (article) 200 accommodating a plurality of semiconductor wafers, and transfers the FOUP 200 to a load port 300 (transfer section) or the like that is a transfer section provided in a processing device that performs various types of processing on the semiconductor wafers. The track 100 is suspended from the ceiling 110 by a suspension column 108. The track 100 includes a traveling rail 101 and a feeder rail 102 that is provided at a lower portion of the traveling rail 101.

The overhead conveyance vehicle 1 includes a frame unit 2, a traveling unit 3a, a power receiving unit 3b, a lateral unit 4, a theta unit 5, an elevating drive unit 6, a gripper device 10, and a controller 8. The frame unit 2 includes a center frame 21, a front frame 22, and a rear frame 23. The front frame 22 extends downward from an end of a front side (front side in a travel direction of the overhead conveyance vehicle 1) in the center frame 21 to a lower side thereof. The rear frame 23 extends downward from an end of a rear side (rear side in the travel direction of the overhead conveyance vehicle 1) in the center frame 21 to the lower side thereof.

The traveling unit 3a and the power receiving unit 3b are disposed on the upper side of the center frame 21. The traveling unit 3a is attached to the traveling rail 101. The power receiving unit 3b receives, for example, power supply in a non-contact manner from a high-frequency current line laid along the feeder rail 102. The power supply to the power receiving unit 3b causes the traveling unit 3a to travel along the track 100. The lateral unit 4 is disposed on the lower side of the center frame 21. The lateral unit 4 moves the theta unit 5, the elevating drive unit 6, and the gripper device 10 to move laterally (side in the travel direction of the overhead conveyance vehicle 1). The theta unit 5 is disposed on a lower side of the lateral unit 4. The theta unit 5 rotates the elevating drive unit 6 and the gripper device 10 in a horizontal surface.

The elevating drive unit 6 is disposed on the lower side of the theta unit 5. The elevating drive unit 6 lifts and lowers gripper device 10. The gripper device 10 is disposed on the lower side of the elevating drive unit 6. The gripper device 10 holds a flange section 202 of the FOUP 200. The controller 8 is disposed on the front frame 22 and the rear frame 23. The controller 8 is an electronic control unit including a CPU, ROM, and RAM. The controller 8 is configured or programmed to control each element or component of the overhead conveyance vehicle 1.

To the front frame 22 and the rear frame 23, four lower drop preventing sections 26 and two lid drop preventing sections 27 that each prevent the FOUP 200 from dropping from the frame unit 2 are attached. The lower drop preventing sections 26 are correspondingly attached to the lower end of the front frame 22 and the lower end of the rear frame 23 at the four corner positions of the frame unit 2 and correspondingly face the front end and the rear end of the bottom of the FOUP 200. The lid drop preventing sections 27 are attached to the lower portion of the front frame 22 and the lower portion of the rear frame 23, respectively, and face the FOUP 200 from the lid 205 side (see FIG. 3). These lower drop preventing sections 26 and the lid drop preventing sections 27 are opened and closed at appropriate timing in association with transfer of the FOUP 200.

The overhead conveyance vehicle 1 configured as described above operates, as an example, described below. When the FOUP 200 is transferred from a load port 300 to the overhead conveyance vehicle 1, the overhead conveyance vehicle 1 that does not hold the FOUP 200 stops above the load port 300. When a horizontal position of the gripper device 10 deviates from the position directly above the load port 300, the horizontal position and an angle of a holding unit are fine-tuned by driving the lateral unit 4 and the theta unit 5 to fine-tune the whole elevating drive unit 6. Subsequently, the elevating drive unit 6 lowers the gripper device 10, and the gripper device 10 holds the flange section 202 of the FOUP 200 that is placed on the load port 300. The elevating drive unit 6 then lifts the gripper device 10 to a lifting end and disposes the FOUP 200 between the front frame 22 and the rear frame 23. The lower drop preventing sections 26 and the lid drop preventing sections 27 are closed. The overhead conveyance vehicle 1 holding the FOUP 200 then begins traveling.

When the FOUP 200 is transferred from the overhead conveyance vehicle 1 to the load port 300, the overhead conveyance vehicle 1 holding the FOUP 200 stops above the load port 300. The lower drop preventing section 26 and the lid drop preventing section 27 are opened. When the horizontal position of the gripper device 10 (FOUP 200) deviates from a position directly above the load port 300, the horizontal position and the angle of the holding unit are fine-tuned by driving the lateral unit 4 and the theta unit 5 to fine-tune the whole elevating drive unit 6. Subsequently, the elevating drive unit 6 lowers the gripper device 10 to place the FOUP 200 on the load port 300, and the gripper device 10 releases its holding of the flange section 202 of the FOUP 200. The elevating drive unit 6 then lifts the gripper device 10 to the lifting end thereof. The overhead conveyance vehicle 1 that does not hold the FOUP 200, then begins traveling.

Figure 2:
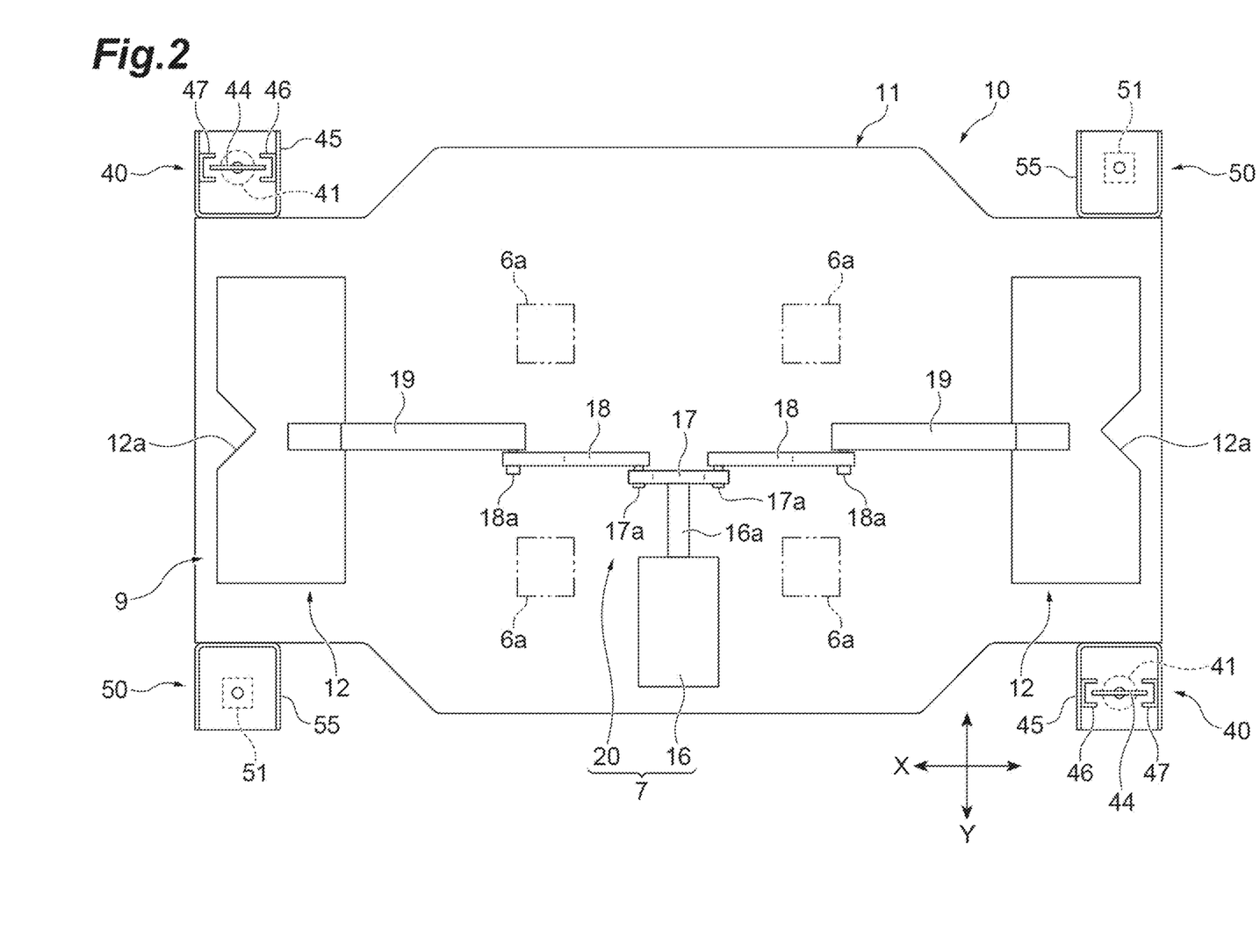
FIG. 2 is a plan view of the gripper device in FIG. 1.

As illustrated in FIG. 2, the gripper device 10 includes an elevating section 11 that defines a body of the gripper device 10 and a holding portion 9 that holds the FOUP 200. The holding portion 9 includes a motor 16 fixed to the elevating section 11, a single link mechanism 20 connected to the motor 16 via an output shaft 16a of the motor 16, and a pair of finger sections (engaging portions) 12 attached to respective tips of the link mechanism 20. The motor 16, the link mechanism 20, and the pair of finger sections 12 are attached to the elevating section 11. The motor 16 and the link mechanism 20 are included in a drive section 7 that moves the pair of finger sections 12. Each of the pair of finger sections 12 may be driven by a ball screw, a belt, or the like, for example, instead of the link mechanism 20. The elevating section 11 is suspended by, for example, four belts 6a that are included in the elevating drive unit 6 described above. The elevating section 11 is capable of lifting and lowering above the FOUP 200 (above the load port 300) when the elevating drive unit 6 is controlled by the controller 8. It should be noted that the elevating drive unit 6 may have three belts 6a and the elevating section 11 may be suspended by the three belts 6a.

Figure 3:
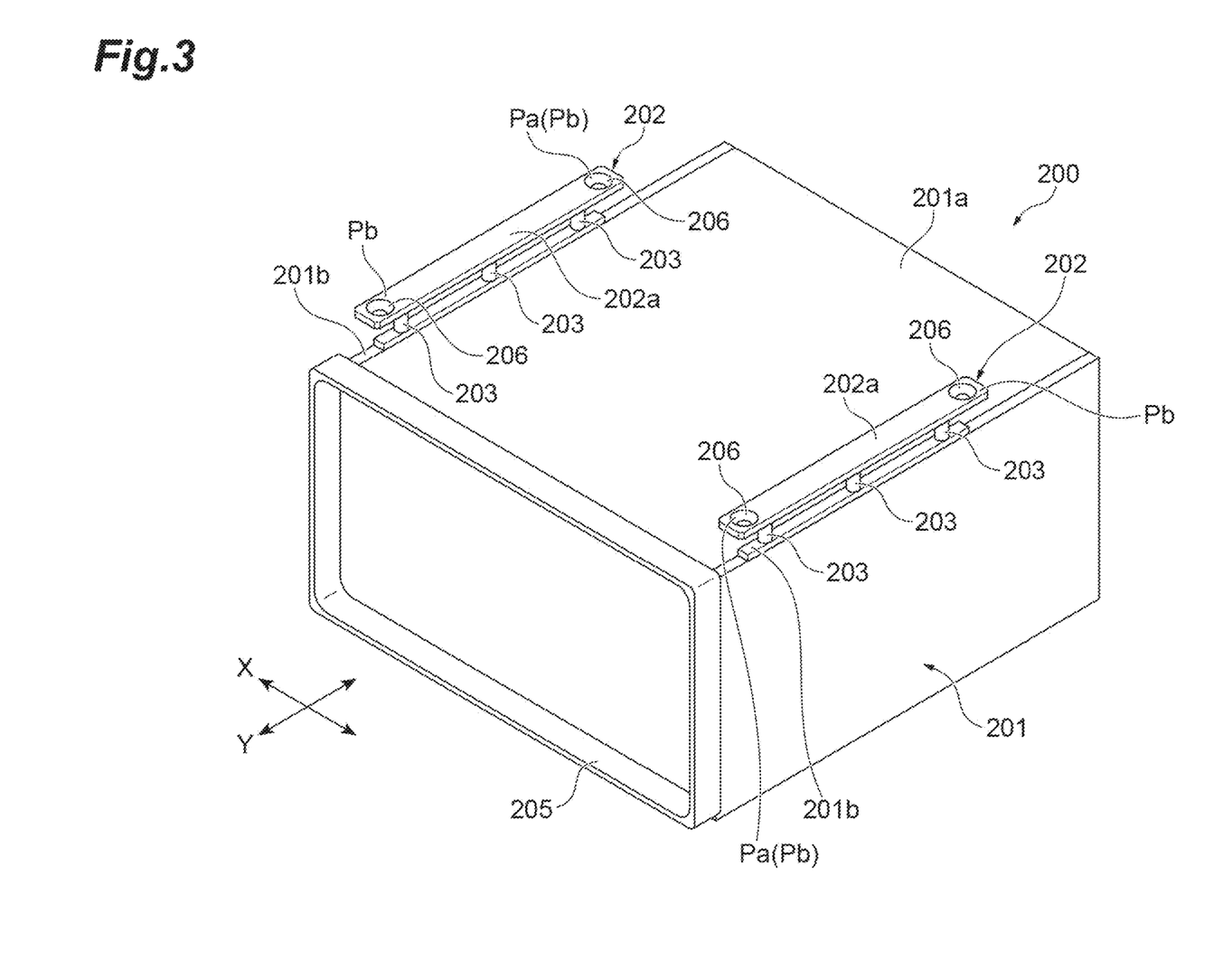
FIG. 3 is a perspective view of an article to be carried by a conveyance vehicle system of FIG. 1.

Referring to FIG. 3, the FOUP 200 held by the gripper device 10 of the present preferred embodiment is described. The FOUP 200 includes a body 201 having a rectangular parallelepiped shape, for example. A lid 205 is attached to a side surface of the body 201 (a surface of a side in the travel direction of the overhead conveyance vehicle 1) so as to be opened and closed freely. The FOUP 200 accommodates a plurality of semiconductor wafers in the body 201. The FOUP 200 may accommodate a plurality of semiconductor panels that each are a rectangular-shaped substrate, within the body 201. A top surface 201a, having a rectangular shape, of the body 201 is provided with a pair of flange sections 202 that are held by the gripper device 10. The pair of flange sections 202 are spaced apart in a direction along the top surface 201a and corresponding to the travel direction of the overhead conveyance vehicle 1 (X direction indicated in the figure). In the following description, this direction is referred to as a "first direction". The pair of flange sections 202 are disposed at ends 201b and 201b in an X direction of the top surface 201a and each extend in a direction along the top surface 201a and orthogonal to the above-described first direction (Y direction indicated in the figure). In the following description, a direction orthogonal to this first direction is referred to as a "second direction". These terms of the first direction and the second direction are able to be used to describe the FOUP 200, and are able to also be used to describe the gripper device 10 that holds the FOUP 200. As described above, the first direction corresponds to the travel direction of the overhead conveyance vehicle 1 in a state where the elevating drive unit 6 and the gripper device 10 are aligned with the frame unit 2.

More specifically, a plurality of pairs (for example, three pairs in the present preferred embodiment) of columns 203 are erected on the top surface 201a of the FOUP 200 at each of the ends 201b and 201b. Each of the columns 203 extends perpendicular to the top surface 201a, and its lower end is fixed to the top surface 201a. At one end 201b in the first direction of the top surface 201a, three equal-length columns 203, for example, are erected, and one plate of the flange section 202 is fixed to the upper end of each of these columns 203 by welding or bolts. At the other end 201b in the first direction of the top surface 201a, for example, three columns 203 having an equal length are erected, and one plate of the flange section 202 is fixed to the upper end of each of these columns 203 by welding or bolts. The pair of flange sections 202 extend parallel, for example, to the top surface 201a of the FOUP 200. As explained above, the FOUP 200 has the pair of flange sections 202 provided on the top surface 201a and spaced apart in the first direction along the top surface 201a.

When the column 203 is provided, a predetermined space exists between the top surface 201a and the flange section 202. As illustrated in FIG. 1, the pair of flange sections 202 fall within a length of the body 201 in the first direction (the overall length of the FOUP 200). The finger section 12 of the gripper device 10 is inserted into a space between the top surface 201a and the flange section 202, from the center of the top surface 201a to the end 201b. The FOUP 200 is held (supported) from below by the finger section 12 that is moved from inside to outside and inserted into the above-described space.

The pair of finger sections 12 of the gripper device 10 moves along the first direction (X direction indicated in the figure). When the gripper device 10 holds the FOUP 200, the finger sections 12 advance to be closer to the flange section 202. When the gripper device 10 releases its holding on the FOUP 200, the finger sections 12 retreat so as to be away from the flange section 202.

As illustrated in FIG. 2, the link mechanism 20 is a mechanism for moving the finger section 12. The link mechanism 20 includes a single central link 17 that is connected to the output shaft 16a of the motor 16 and rotates about the output shaft 16a, a pair of first links 18 the first ends of which are rotatably connected to a pair of shafts 17a provided at both ends of the central link 17, and a pair of second links 19 the base ends of which are rotatably connected to a pair of shafts 18a provided at the second ends of the first links 18. As the output shaft 16a rotates, the central link 17 rotates, and the first link 18 and the second link 19 on one side and the first link 18 and the second link 19 on the other side move synchronously. The finger section 12 is attached to the tip of each of the pair of second links 19. The finger section 12 includes a notch 12a that accepts the central column 203.

The gripper device 10 of the present preferred embodiment is provided with a positioning mechanism to position the holding portion 9 with respect to the FOUP 200. The need for proper positioning for articles is as described in the above-described Japanese Unexamined Patent Publication No. 2016-163001. Proper positioning ensures that the finger section 12 (holding portion 9) of the gripper device 10 has a correct position and orientation and a suitable engagement and retention with the FOUP 200. The positioning mechanism provided in the gripper device 10 enables more accurate positioning in cooperation with the position detected portion and the contact position that the FOUP 200 has.

As illustrated in FIG. 2, the gripper device 10 has the four positioning sections attached to the elevating section 11. More specifically, the gripper device 10 is provided with positioning sections at the four corner positions of the elevating section 11 having a rectangular shape in plan view. Two first positioning sections 40 are attached on one diagonal of the elevating section 11 (upper left and lower right corners indicated in FIG. 2). These first positioning sections 40 basically position the holding portion 9 in the horizontal direction (along the XY plane) to the FOUP 200. Two second positioning sections 50 are attached on the other diagonal of the elevating section 11 (upper right and lower left corners indicated in FIG. 2). These second positioning sections 50 position the holding portion 9 in the height direction direction indicated in FIG. 1) to the FOUP 200.

Before describing the structure of the first positioning section 40 and the second positioning section 50, the structure of the FOUP 200 according to the positioning mechanism is described with reference to FIG. 3. As illustrated in FIG. 3, the flange sections 202 of the FOUP 200 are long, flat plate members each extending long in the second direction and parallel to the top surface 201a of the FOUP 200. A flange top surface 202a of each flange section 202 is flat and parallel to the top surface 201a. The flange top surface 202a is a position detected surface (position detected portion) provided on the top surface 201a of the FOUR 200, and enables, when contacting the first positioning section 40 and the second positioning section 50, positioning of the holding portion 9 in the height direction.

Two guide holes 206 are located at both ends of each flange section 202 in the second direction. These guide holes 206 have the same size and shape. Each of the guide holes 206 has an inverted conical trapezoidal shape and penetrates the flange section 202 in a thickness direction. Each of the guide holes 206 has a circular opening that is open upward and has a conical tapered shape with a smaller inner diameter downward. In other words, in each of the guide holes 206, the lower the height of the top end to the opening, the smaller the inside diameter. In the pair of flange sections 202, the guide holes 206 are symmetrical with respect to a hypothetical central plane orthogonal to the first direction (plane containing an axis of the output shaft 16a). The positions of these four guide holes 206 correspond to the positions of the first positioning sections 40 and the second positioning sections 50 in plan view. More precisely, when the holding portion 9 is in an exact position with respect to the FOUP 200, the positions of the central axes of the four guide holes 206 coincide with the positions of the shafts 42 of the first positioning section 40 and the shafts 52 of the second positioning section 50, as described below. Of the four guide holes 206, the two guide holes 206 disposed on the first diagonal enable, when contacting the first positioning section 40, positioning in the horizontal direction of the holding portion 9. At the same time, the two guide holes 206 disposed on the first diagonal also enable, when contacting the two first positioning sections 40, positioning of the holding portion 9 in the height direction.

The two second positioning sections 50, out of the four guide holes 206, do not contact the two guide holes 206 disposed on the second diagonal. In the present preferred embodiment, the two second positioning sections 50 only contact the flange top surface 202a at the position where the two guide holes 206 disposed on the second diagonal are located. The versatility of FOUP 200 is enhanced by the fact that the FOUP 200 has four guide holes 206. The four guide holes 206 can be used, for example, when the FOUP 200 is handled by an automated guided vehicle (AGV), which is another transport system different from the overhead conveyance vehicle 1 in the present preferred embodiment.

Figure 4:
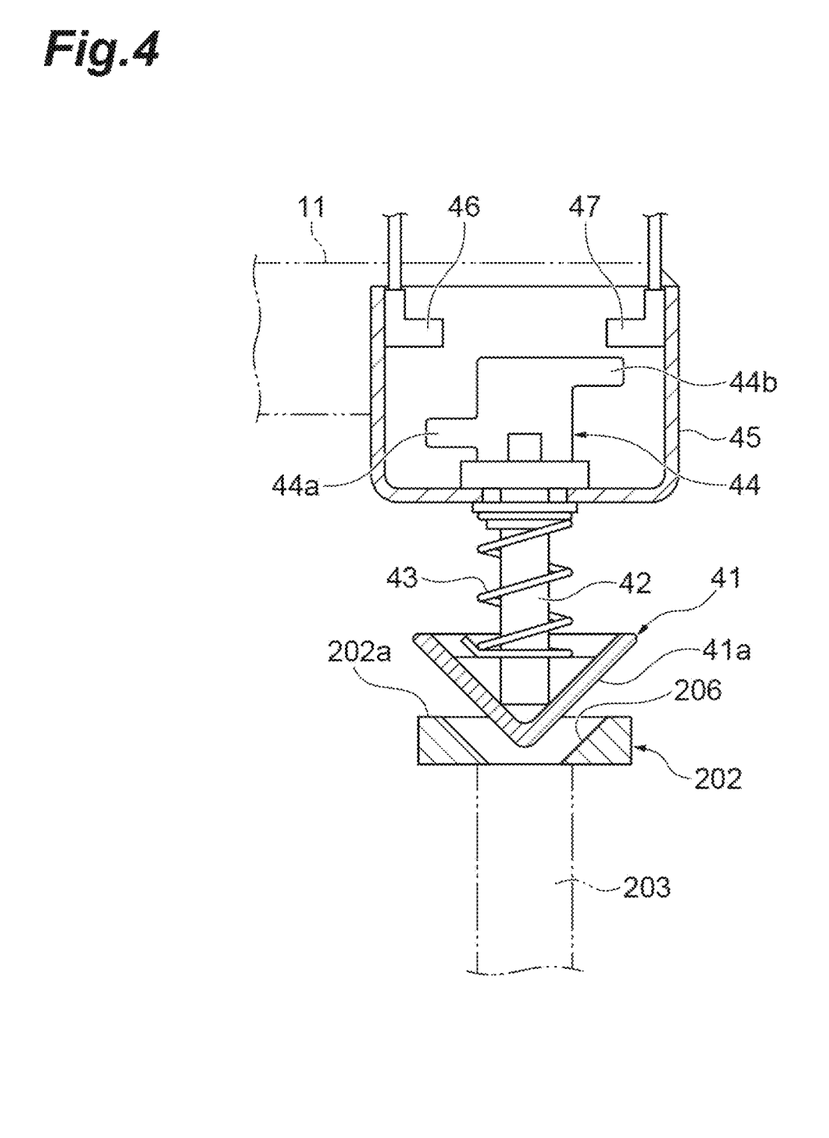
FIG. 4 is a cross-sectional view of a structure of a first positioning section.
Figure 5:
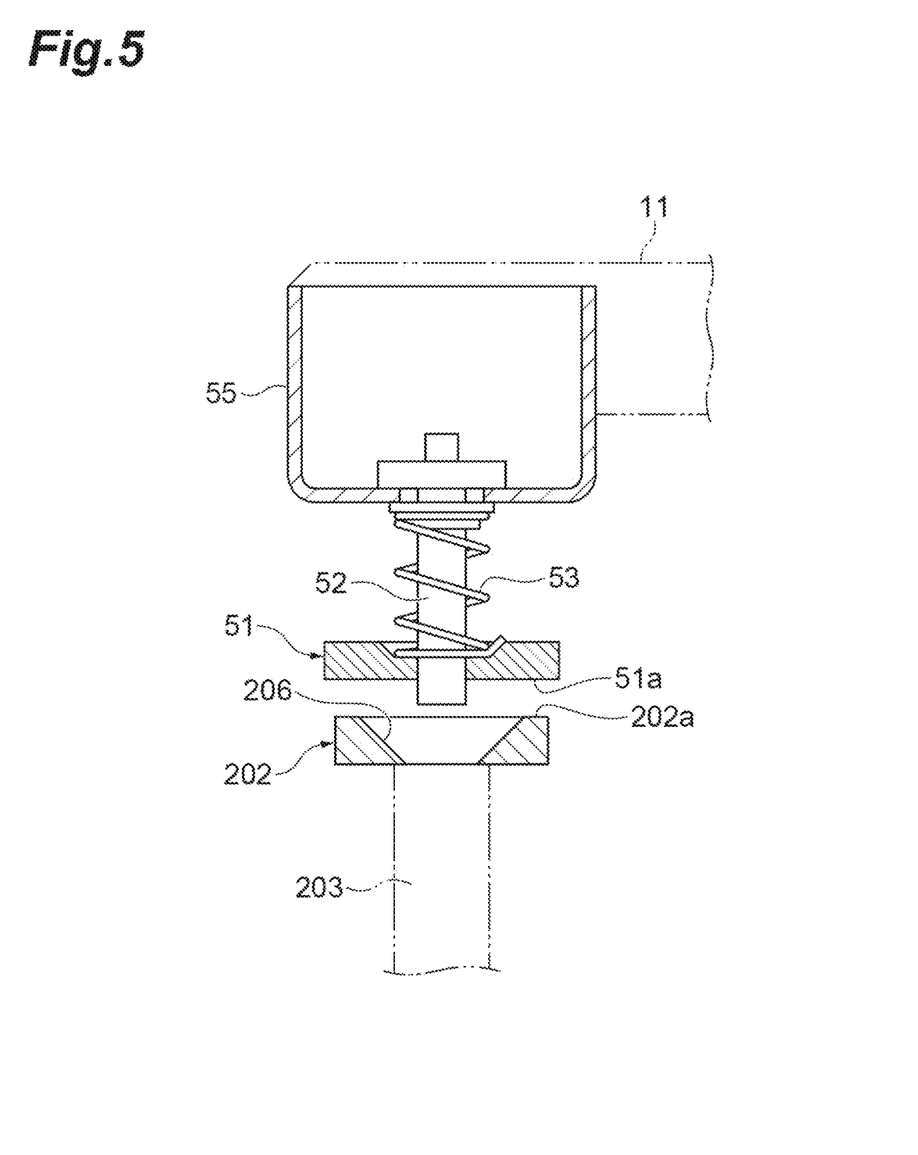
FIG. 5 is a cross-sectional view of the structure of the second positioning section.

Referring to FIGS. 2, 4, and 5, the structures of the first positioning section 40 and the second positioning section 50, respectively, are described. As illustrated in FIGS. 2 and 4, the first positioning section 40 includes a sensor box 45 fixed to a corner of the elevating section 11, a shaft 42 capable of moving in a vertical direction with respect to the sensor box 45, and a convex member 41 fixed to the lower end of the shaft 42. The sensor box 45, for example, is open in a vertical direction and its side surface is fixed to an outer side surface of the elevating section 11. The convex member 41 may include a conical surface portion 41a. The conical surface portion 41a has a shape corresponding to the guide hole 206, for example, to engage with the guide hole 206 in the flange section 202. In other words, a portion of the conical surface portion 41a of the convex member 41 has a shape that substantially coincides with a peripheral wall surface of the guide hole 206. A spring 43 is interposed between the bottom of the sensor box 45 and the convex member 41 around the shaft 42. The spring 43 exerts a force with respect to the convex member 41 and the sensor box 45 in a direction of being spaced apart from each other.

A position detection plate 44 is fixed to an upper end of the shaft 42. A seating sensor 46 and a presence sensor 47 are installed in opposing positions in an upper portion of the inside of the sensor box 45. The seating sensor 46 and the presence sensor 47 are fixed to the sensor box 45 and detect presence of a first detected piece 44a and a second detected piece 44b according to a relative movement of the position detection plate 44 in the sensor box 45. The seating sensor 46 is a sensor that detects seating of the holding portion 9 (i.e., whether the convex member 41 is inserted into the guide hole 206 of the flange section 202). The presence sensor 47 is a sensor that detects the presence of the FOUP 200 in a state in which the FOUP 200 is lifted. For example, if the FOUP 200 is absent, the presence sensor 47 is turned off and an abnormal alarm is issued. As an absence of the FOUP 200, for example, loss of engagement of the FOUP 200 to the finger section 12 due to falling of the flange section 202 can be considered. Cables to output signals to the controller 8 are connected to the seating sensor 46 and the presence sensor 47. The detection operations of these sensors associated with the lifting and lowering of the elevating section 11 and the holding of the FOUP 200 by the gripper device 10 are described below.

As illustrated in FIGS. 2 and 5, the second positioning section 50 includes a box 55 fixed to a corner of the elevating section 11, a shaft 52 capable of moving in a vertical direction with respect to the box 55, and a flat plate-shaped pressing member 51 fixed to the lower end of the shaft 52. The box 55, for example, is open in a vertical direction, and its side surface is fixed to the outer side surface of elevating section 11. The pressing member 51 may include a horizontal surface portion 51a that contacts the flange top surface 202a of the FOUP 200. The lower end of the shaft 52 may somewhat protrude from a bottom surface of the pressing member 51. In a state in which the horizontal surface portion 51a is in contact with the flange top surface 202a, a protruding portion of the shaft 52 is disposed inside the guide hole 206. A spring 53 is interposed between the bottom of the box 55 and the pressing member 51 around a shaft 52. The spring 53 exerts a force with respect to the pressing member 51 and the box 55 in the direction of being spaced apart from each other.

In the first positioning section 40 and the second positioning section 50, the height of the convex member 41 to the guide hole 206 and the height of the pressing member 51 to the flange top surface 202*a* are equal. In other words, in a state in which the conical surface portion 41*a* of the convex member 41 contacts the peripheral wall surface of the guide hole 206 and the horizontal surface portion 51*a* of the pressing member 51 contacts the flange top surface 202*a*, and the force (repulsive force) received from the spring 43 and the force from spring 53 are equal, the elevating section 11 and the holding portion 9 are parallel with respect to the top surface 201*a* of the FOUP 200 in the posture. In other words, the holding portion 9 is positioned in the height direction with respect to the FOUP 200. In other words, in a state in which the convex member 41 contacts the peripheral wall surface of the guide hole 206 (convex member 41 fits into the guide hole 206), the pressing member 51 contacts (rides on) the flange top surface 202*a*, and the elevating section 11 and the holding portion 9 that are suspended by the four belts 6*a* are on the flange section 202 with their own weights, the holding portion 9 is positioned in the height direction with respect to the FOUP 200. Moreover, in this state, the holding portion 9 is also positioned horizontally with respect to the FOUP 200 by fitting (fitting of a tapered shape) of the convex member 41 with respect to the guide hole 206.

In the gripper device 10 and the FOUP 200 having the above-described configuration, as illustrated in FIG. 3, positions at which the two guide holes 206 disposed on the first diagonal in the flange section 202 are located are two first contact positions Pa that the first positioning section 40 contacts. The holding portion 9 is positioned in the horizontal direction with respect to the FOUP 200 when the first positioning section 40 contacts the FOUP 200 at the two first contact positions Pa in the upper portion of the FOUP 200.

In the flange section 202, the two guide holes 206 disposed on the first diagonal are also the two second contact positions Pb that the first positioning section 40 contacts. In addition, positions at which the two guide holes 206 disposed on the second diagonal are located are the two second contact positions Pb that the second positioning section 50 contacts. The holding portion 9 is positioned in the height direction with respect to the FOUP 200, when the first positioning section 40 and the second positioning section 50 contact the FOUP 200 at the four second contact positions Pb in the upper portion of the FOUP 200.

The first contact position Pa is a contact position for positioning of the holding portion 9 in the horizontal direction in the upper portion of the FOUP 200. The second contact position Pb is a contact position for positioning of the holding portion 9 in the height direction in the upper portion of the FOUP 200. In the present preferred embodiment, positions at which the two guide holes 206 disposed on the first diagonal are located are the two first contact positions Pa and the two second contact positions Pb. The first positioning section 40 includes two convex members 41 that are capable of entering the respective two guide holes 206. This configuration allows the first positioning section 40 to also position the holding portion 9 in the height direction and to perform (serve) the same function as the second positioning section 50.

In other words, in the present preferred embodiment, the first positioning section 40 contacts the FOUP 200 at only the two first contact positions Pa for positioning in the horizontal direction. The four second contact positions Pb for positioning in the height direction are provided at four respective locations. In other words, the gripper device 10 positions the holding portion 9 in the horizontal direction and the vertical direction by bringing the convex member 41 of the first positioning section 40 into contact with the two guide holes 206 as the first contact position Pa and the second contact position Pb. The gripper device 10 positions the holding portion 9 in the height direction by bringing the pressing member 51 of the second positioning section 50 into contact with the two guide holes 206 as the second contact position Pb. The first positioning section 40 performs (serves) the same function as the second positioning section 50 in some of the locations (two locations in the present preferred embodiment) out of the required three or more locations of positioning in the height direction. These second contact positions Pb are not located on the straight line. In other words, when three of the four second contact positions Pb are selected, they are not located on the straight line. The phrase "three second contact positions are not located on the straight line" means, for example, that if contact portions (contact surfaces) at the respective second contact positions have an area, a line connecting three center points of those contact portions is not in a straight line. The phrase "the three second contact positions are not located on the straight line" means that the plane containing the three center points is uniquely defined.

The following describes the conveyance method of the FOUP 200 by the gripper device 10 and the overhead conveyance vehicle 1 of the present preferred embodiment. First, when the elevating section 11 arrives above the load port 300, the controller 8 lowers the elevating section 11 (lowering step). In this lowering step, the elevating section 11 is lowered until the seating sensor 46 turns ON. After the lowering step, the holding portion 9 is positioned in the horizontal direction with respect to the FOUP 200 by bringing the first positioning section 40 into contact with the FOUP 200 at the two first contact positions Pa in the upper portion of the FOUP 200 (first positioning step). After the lowering step, the holding portion 9 is positioned in the height direction with respect to the FOUP 200 by bringing the first positioning section 40 and the second positioning section 50 into contact with the FOUP 200 at the four second contact positions Pb that are not located on the straight line in the upper portion of the FOUP 200 (second positioning step). The first positioning step and the second positioning step are performed at substantially the same time. After these first and second positioning steps, the FOUP 200 is held by the holding portion 9 (holding step).

Figure 6:
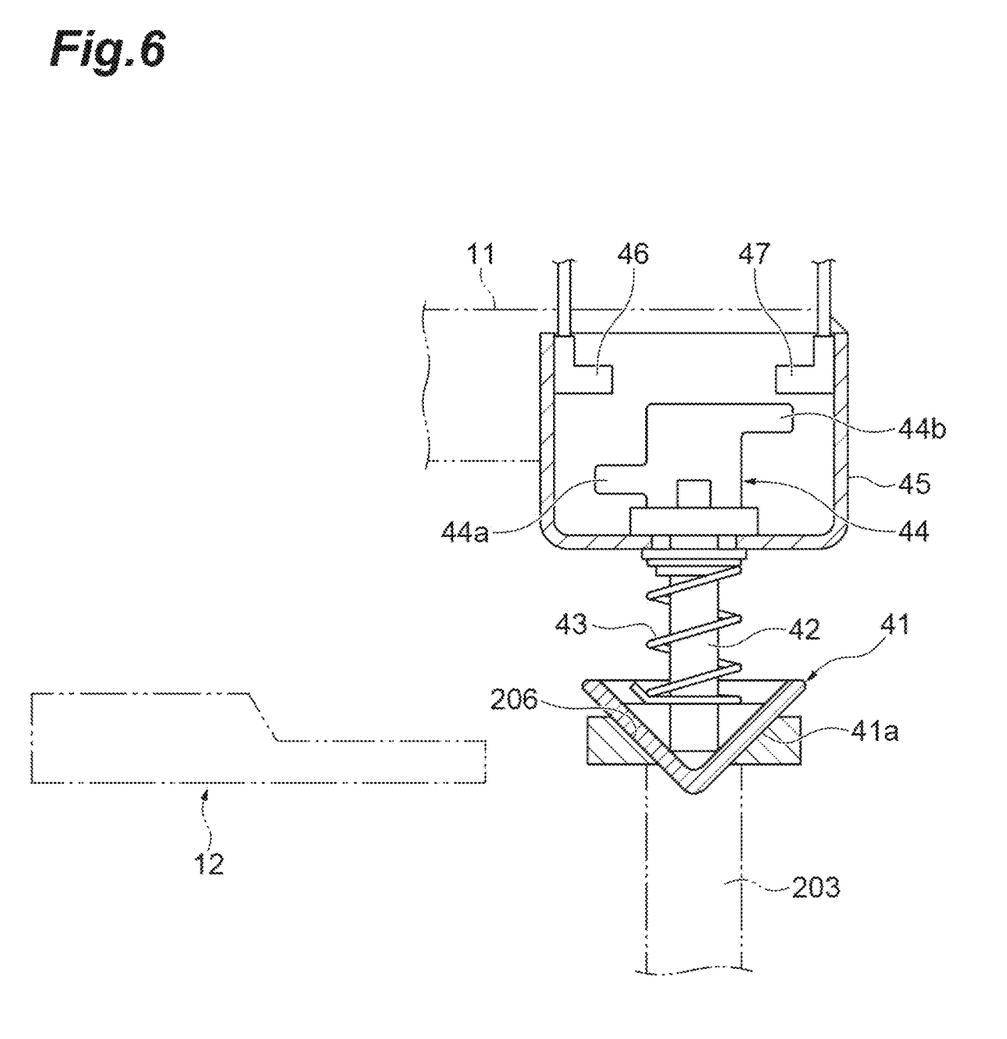
FIG. 6 is a diagram illustrating arrangement of the first positioning section and the held portion of the article in a first positioning process.
Figure 7:
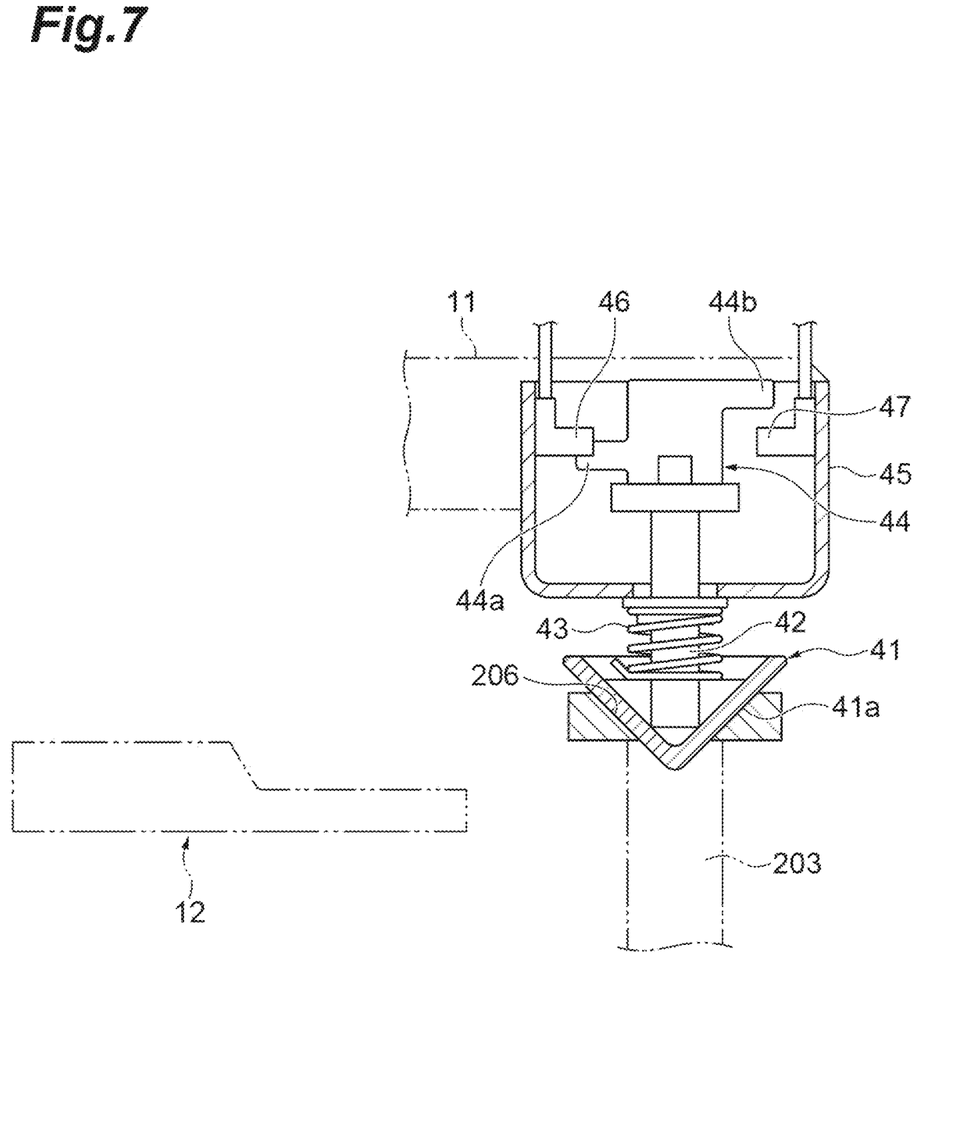
FIG. 7 is a diagram illustrating a state in which the elevating section is lowered following the state indicated in FIG. 6.
Figure 8:
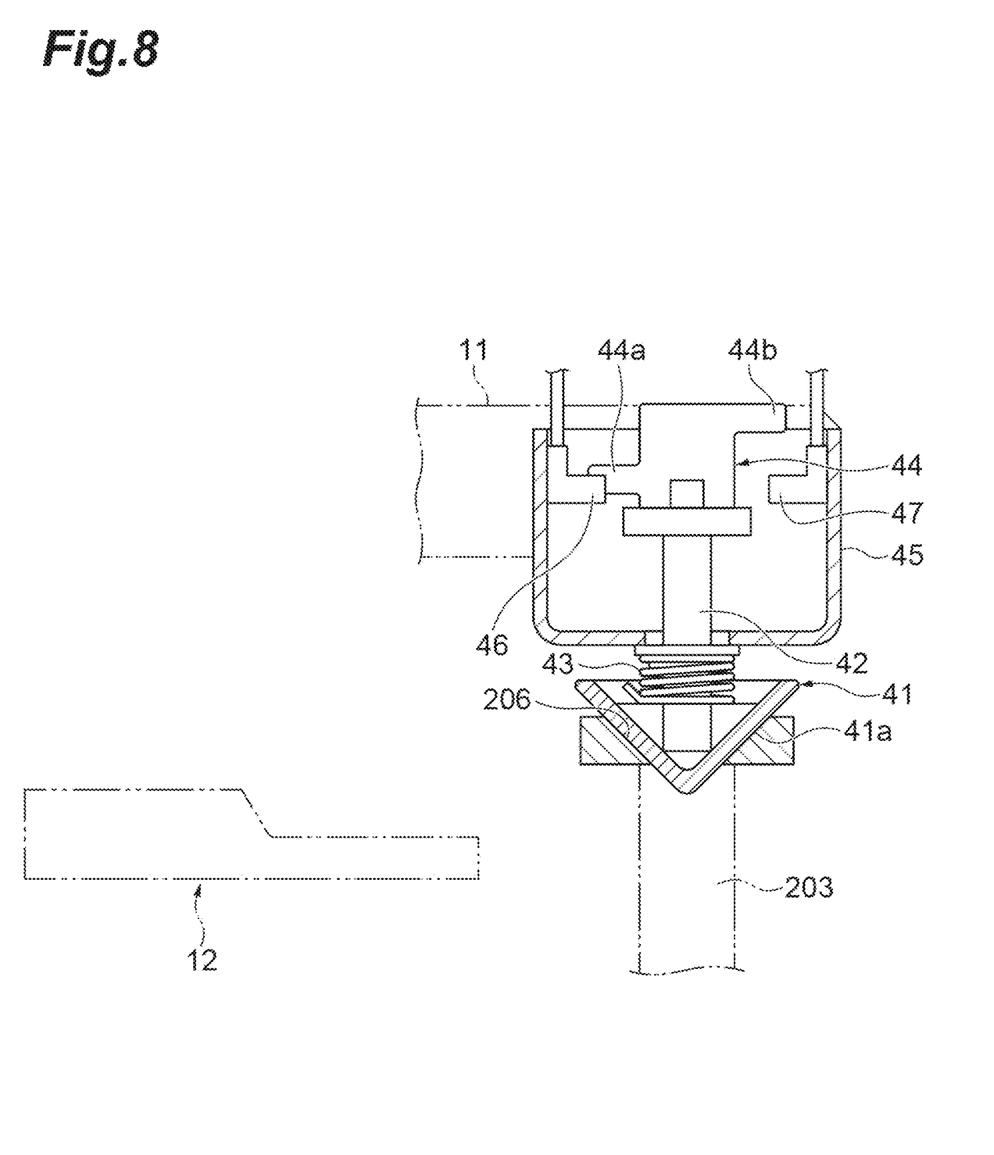
FIG. 8 is a diagram indicating a state in which the elevating section is lowered following the state indicated in FIG. 7.

Referring to FIGS. 6 to 10, the following describes the first positioning step and the holding step. In accordance with the lowering of the elevating section 11, as illustrated in FIG. 6, the convex member 41 enters (is inserted) into the guide hole 206. At this point, the conical surface portion 41*a* of the convex member 41 contacts the peripheral wall surface of the guide hole 206 for the first time. Next, as illustrated in FIG. 7, the elevating section 11 and holding portion 9 are further lowered, and the seating sensor 46 turns ON. During this time, the presence sensor 47 switches from OFF to ON and then to OFF, but this switching of the presence sensor 47 is ignored because the seating sensor 46 remains OFF. Next, as illustrated in FIG. 8, when the elevating section 11 and the holding portion 9 are further lowered for a predetermined distance, their lowering stops. The series of steps described above completes the first positioning step. At the same time, the second positioning step is completed.

Figure 9:
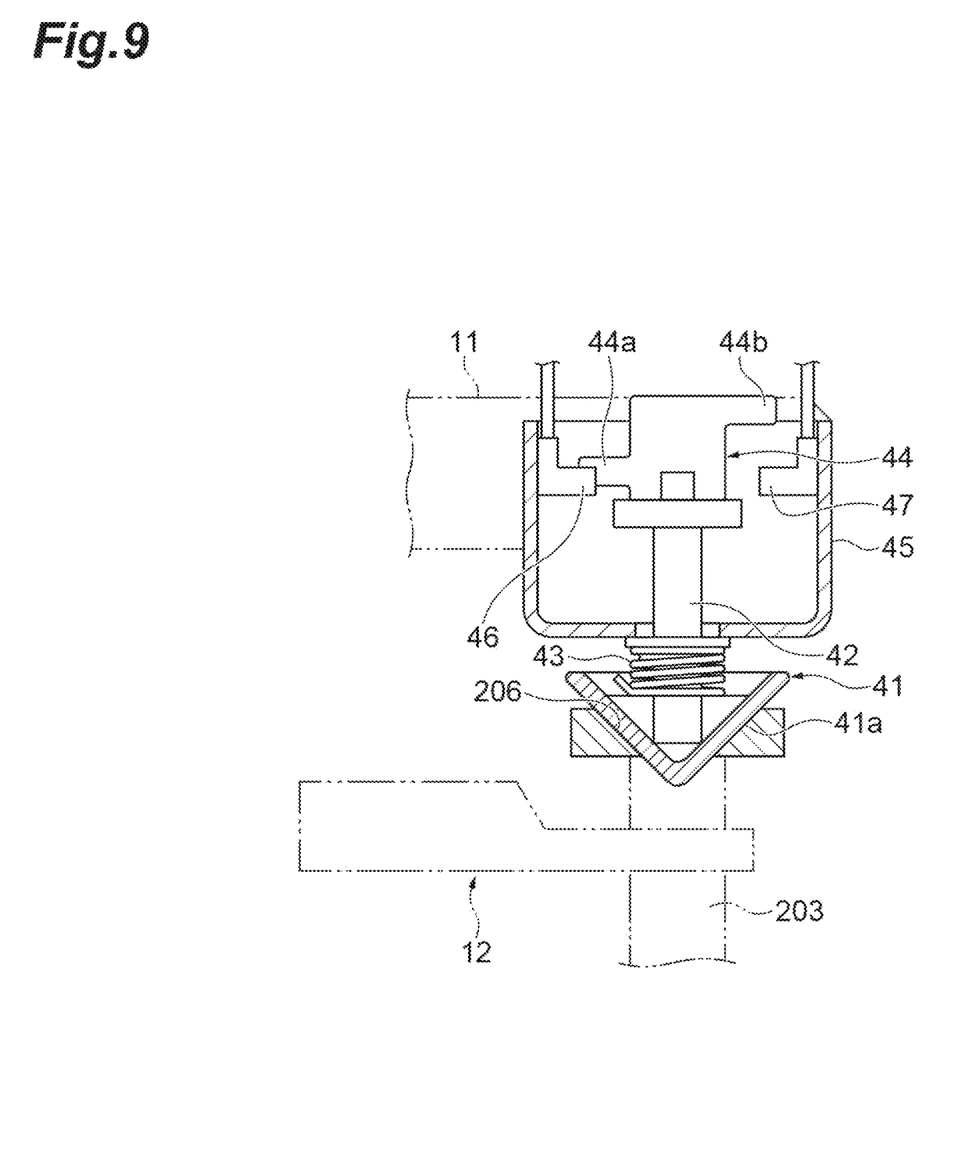
FIG. 9 is a diagram indicating the state in which the holding portion has moved to the engaging position of the held portion following the state indicated in FIG. 8.
Figure 10:
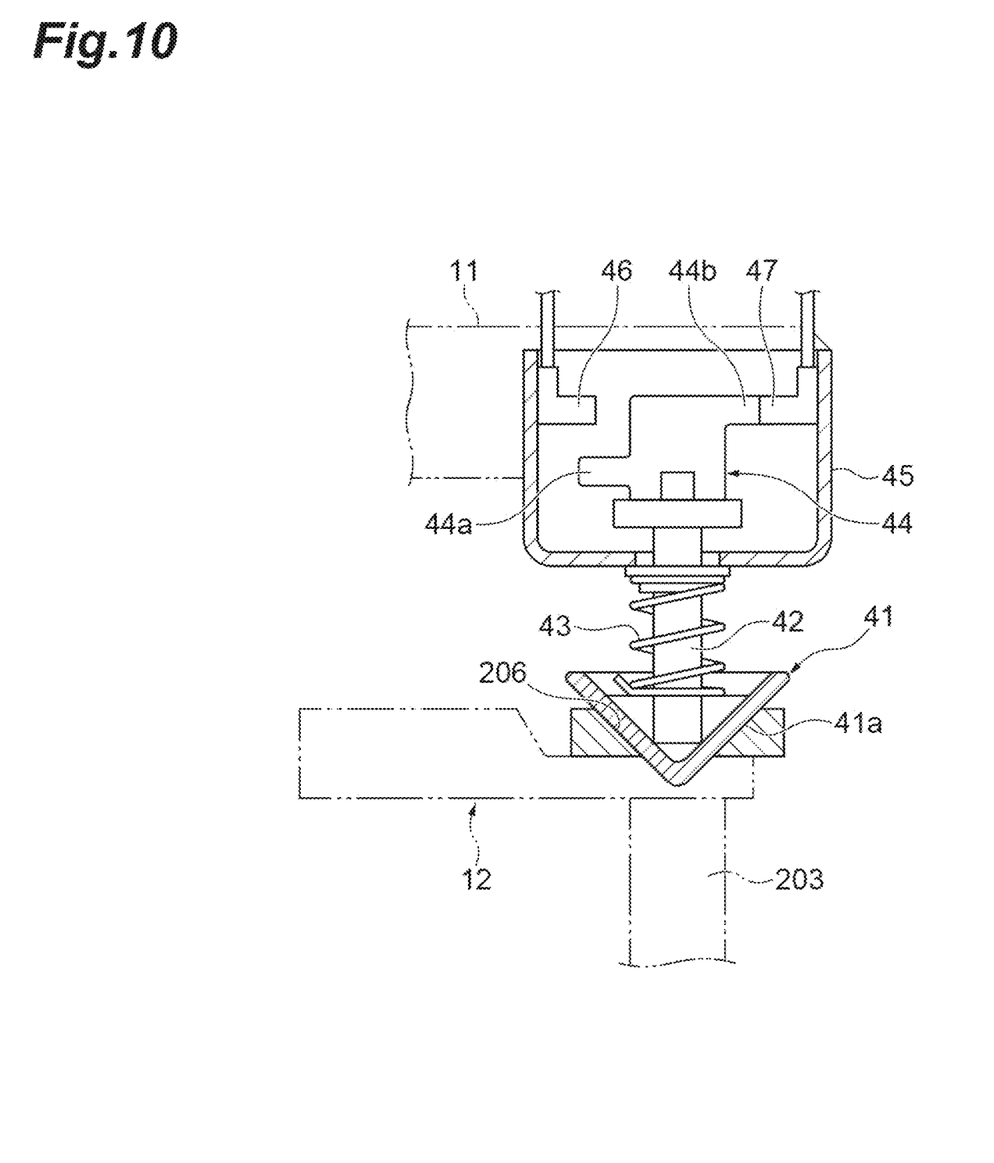
FIG. 10 is a diagram indicating the state in which the holding portion engages with the held portion to hold the article following the state illustrated in FIG. 8.

Next, as illustrated in FIG. 9, with the seating sensor 46 turned on, the drive section 7 moves the finger section 12, and the finger section 12 is inserted into the space below the flange section 202. Then, as illustrated in FIG. 10, the elevating section 11 and holding portion 9 are lifted and the flange section 202 (FOUP 200) is held by the finger section 12. The foregoing step completes the holding step. Then, the elevating section 11 and holding portion 9 are lifted until they reach inside the frame unit 2.

According to the gripper device 10 of the present preferred embodiment and the above-described conveyance method, the first positioning section 40 contacts the FOUP 200 at the two first contact positions Pa in the upper portion of the FOUP 200. The contact of the first positioning section 40 provides positioning of the holding portion 9 in the horizontal direction with respect to the FOUP 200. The first positioning section 40 and the second positioning section 50 contact the FOUP 200 at at least three second contact positions Pb (four in the present preferred embodiment) in the upper portion of the FOUP 200. Since these second contact positions Pb are not located on the straight line, the contact of the first positioning section 40 and the second positioning section 50 provides positioning of the holding portion 9 in the height direction with respect to the FOUP 200. Thus, two contact positions in the horizontal direction and at least three contact positions in the height direction are used, positioning with respect to the FOUP 200 in the horizontal and height directions can be accurately performed.

When the first positioning section 40 contacts the FOUP 200 at three or more first contact positions, the position of the holding portion 9 in the horizontal direction is not likely to be uniquely determined at two of the three positions and at one other position, resulting in inconsistencies. In other words, a competition may occur among the three or more first contact positions. If the number of locations of the first contact position Pa is limited to only two locations, such inconsistency, that is, a competition, is suppressed.

The first positioning section 40 functions similarly to the second positioning section by having two convex members 41 capable of entering the respective two guide holes 206. The two first contact positions and the two second contact positions are made common, which makes it possible to reduce components for positioning in the number.

According to the pressing member 51 including the horizontal surface portion 51a, positioning in the height direction can be performed accurately and easily.

Since the four second contact positions are provided at the respective four locations, positioning can be performed in the height direction more precisely.

According to the overhead conveyance vehicle 1, the holding portion holds the FOUP 200 in a state of being precisely positioned with respect to the FOUP 200. Therefore, the FOUP 200 can be transported in a stable condition, and thereby the FOUP 200 can be carried at high speed.

Figure 11A:
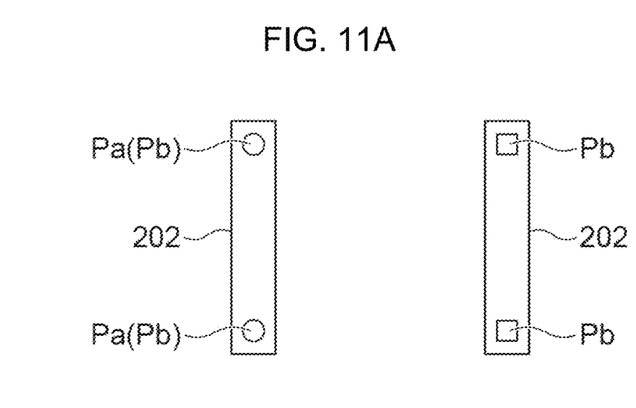
FIGS. 11A to 11D are diagrams indicating various variations on the arrangement of the first contact position and the second contact position.
Figure 11B:
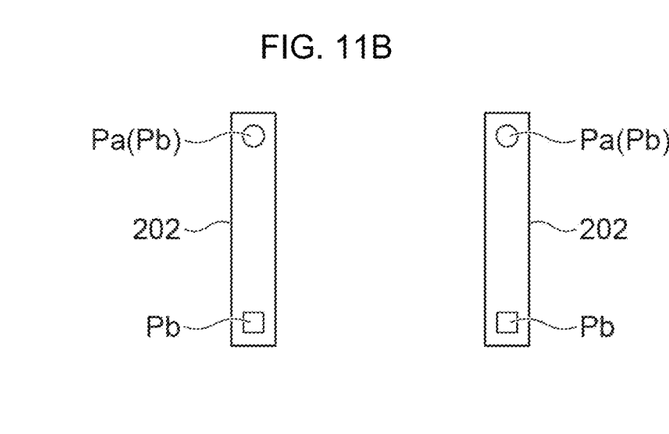
Figure 11C:
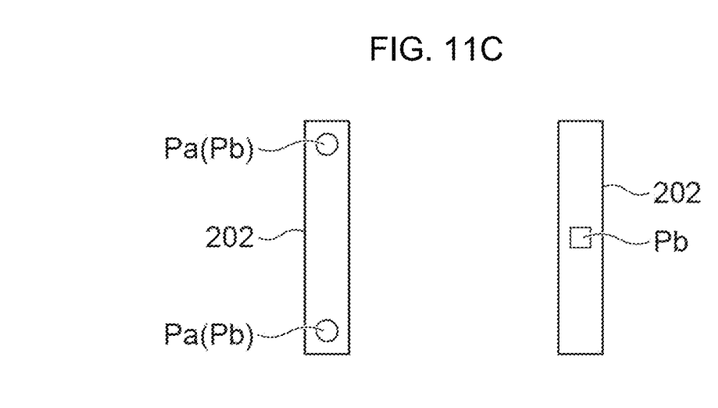
Figure 11D:
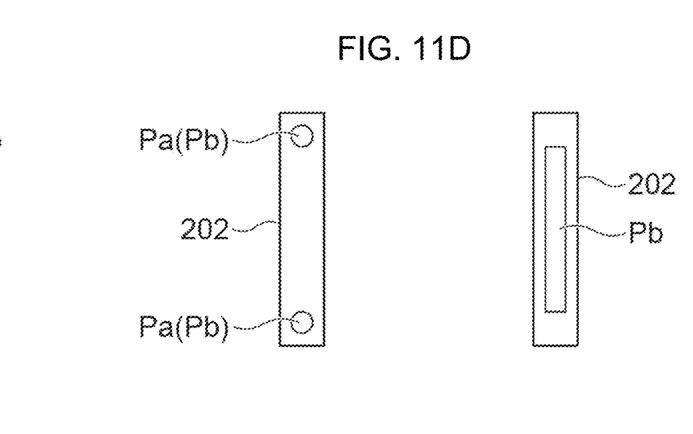

Although the preferred embodiments of the present disclosure has been described above, the present invention is not limited to the above-described preferred embodiments. For example, the arrangement of the first contact position Pa and the second contact position Pb may be modified to provide various aspects. As illustrated in FIG. 11A, the two first contact positions Pa (which also serve as the second contact positions due to the tapered shape) may be set on one flange section 202 and the two second contact positions Pb may be set on the other flange section 202. It is not limited to a case where the contact positions of the same type are disposed on the diagonal as in the above-described preferred embodiment, but the contact positions of the same type may be disposed on the same side in the second direction, as illustrated in FIG. 11B. In this case also, the first contact position Pa also serves as the second contact position due to the tapered shape. As illustrated in FIG. 11C, the two first contact positions Pa (which also serve as the second contact positions due to the tapered shape) may be set on one flange section 202 and one second contact position Pb may be set on the other flange section 202. As illustrated in FIG. 11D, the two first contact positions Pa (which also serve as the second contact positions due to the tapered shape) may be set on one flange section 202 and one large (extensive) second contact position Pb on the other flange section 202. Having the extensive second contact position Pb provides the same stability as including a plurality of the second contact positions Pb.

The position detected portion that the first positioning section and the second positioning section contact may be provided at an appropriate position on the upper portion of the article. The flange section need not be installed on the top surface of the article, and the position detected portion may be provided on a portion other than the flange section. The position detected portion can be set as a horizontal surface (surface parallel to the top surface 201a of the body 201). It is not limited to a case where the holding portion engages with the flange section, and the holding portion may engage with any portion of the upper portion (including a side surface) of the article. The configuration of the holding portion is not limited to the above-described preferred embodiment. The aspect of the engaging portion of the holding portion is not limited to an aspect in which the engaging portion of the holding portion is moved from the inside to the outside. The engaging portion of the holding portion may be moved from the outside toward the inside.

The aspect of the first positioning section and the second positioning section is not limited to an aspect in which positioning includes a spring mechanism. The first positioning section and the second positioning section may include elastic members other than springs or need not include elastic members. The first positioning section and the second positioning section may include a damper mechanism. The second positioning section may be a flat plate member in which a position with respect to the elevating section 11 is fixed.

In the above-described preferred embodiment, sensors (seating sensor 46 and presence sensor 47) are installed in the first positioning section 40. In contrast to this aspect, no sensor need be installed in the first positioning section 40, and a sensor (for example, the seating sensor or the presence sensor that is similar to that disclosed in the above-described preferred embodiments) may be installed in the second positioning section 50. These sensors may be installed in both the first positioning section 40 and the second positioning section 50. In other words, these sensors may be installed at the four corners of the elevating section 11.

In the above-described preferred embodiment, a guide hole 206 is provided that passes through the flange section 202. The aspect is not limited to this aspect, and a guide hole of a tapered shape having a bottom (not passing through the flange section 202) may be provided. Furthermore, the aspect is not limited to an aspect in which the conical guide hole 206 is provided in the article. For example, the first positioning section may have a cylindrical convex member and a cylindrical hole (a through-hole) may be provided at any portion on the upper portion of the article. In this case, because positioning cannot be performed at the first positioning section in the height direction, at least three second contact positions need to be provided on the article, at locations other than those of the two first contact positions.

In other words, the aspect is not limited to the aspect in which the first contact position also serves as the second contact position. The two first contact positions and the three or more second contact positions may be provided separately. Alternatively, one of the two first contact positions may also serve as the second contact position. In both aspects, the gripper device includes the first positioning section corresponding to the first contact position and the second positioning section corresponding to the second contact position. When a certain first contact position also serves as a second contact position in the article, the first positioning section corresponding to that certain first contact position in the gripper device performs the same function as the second positioning section.

An article is not limited to the FOUP 200. The article may be a standard mechanical interface (SMIF) pod or a front opening shipping box (FOSB), or the like.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A gripper device that holds an article placed on a transfer section, the gripper device comprising:
    a holding portion that is attached to an elevating section capable of lifting and lowering above the transfer section to hold the article;
    a first positioning section that is attached to the elevating section; and
    a second positioning section that is attached to the elevating section; wherein
    the first positioning section includes two horizontal and height positioning sections to position the holding portion in a horizontal direction and in a height direction with respect to the article by respectively contacting the article at two contact positions in an upper portion of the article, the two contact positions serve as two first contact positions and a first and a second of three second contact positions;
    the second positioning section includes a height positioning section to position the holding portion only in the height direction with respect to the article by contacting the article at another contact position in an upper portion of the article, the another contact position serves as a third of the three second contact positions;
    the first positioning section and the second positioning section collectively position the holding portion in the height direction with respect to the article by contacting the article at the three second contact positions; and
    the three second contact positions are not located on a straight line in the upper portion of the article.

2. The gripper device according to claim 1, wherein the two horizontal and height positioning sections contact the article at only the two first contact positions.

3. The gripper device according to claim 1, wherein
    a position detected portion provided on a top surface of the article has an opening opened upward and includes two guide holes of a tapered shape each having an inner diameter that decreases as a height of the tapered guide hole to the opening decreases, positions at which the two guide holes are respectively located are the two contact positions; and
    the two horizontal and height positioning sections include two convex members that are capable of entering the respective two guide holes.

4. The gripper device according to claim 1, wherein the height positioning section includes at least one pressing portion including a horizontal surface portion that contacts a position detected portion provided on a top surface of the article at the third of the three second contact positions.

5. The gripper device according to claim 1, wherein four second contact positions including the three second contact positions and an additional contact position serving as a fourth second contact position are provided at respective four locations.

6. A conveyance vehicle comprising the gripper device according to claim 1 operable to travel along a track provided on a ceiling.

7. A conveyance method for holding to carry an article placed on a transfer section by a gripper device, wherein the gripper device includes a holding portion that is attached to an elevating section capable of lifting and lowering above the transfer section to hold the article, a first positioning section attached to the elevating section and including two horizontal and height positioning sections to position the holding portion in a horizontal direction and in a height direction with respect to the article by respectively contacting the article at two contact positions in an upper portion of the article, the two contact positions serving as two first contact positions and a first and a second of three second contact positions, and a second positioning section attached to the elevating section and including a height positioning section to position the holding portion only in the height direction with respect to the article by contacting the article at another contact position in an upper portion of the article, the another contact position serves as a third of the three second contact positions, the method comprising:
    a lowering step of lowering the elevating section;
    a first positioning step of positioning the holding portion in the horizontal direction with respect to the article by bringing the two horizontal and height positioning sections into contact with the article at the two first contact positions, the first positioning step being performed after the lowering step;
    a second positioning step of positioning the holding portion in the height direction with respect to the article by bringing the two horizontal and height positioning sections into contact with the article at the first and the second of the three second contact positions and bringing the height positioning section into contact with the article at the third of the three second contact positions, the second positioning step being performed after the lowering step; and
    a holding step of holding the article by the holding portion, the holding step being performed after the first positioning step and the second positioning step; wherein
    the three second contact positions are not located on a straight line in the upper portion of the article.

* * * * *